US006881377B2

(12) United States Patent
Katayama et al.

(10) Patent No.: US 6,881,377 B2
(45) Date of Patent: *Apr. 19, 2005

(54) METHODS FOR MANUFACTURING CAPACITORS AND ELECTRODES USING ULTRAFINE NICKEL POWDER

(75) Inventors: Hideshi Katayama, Tokyo (JP); Kan Saito, Tokyo (JP); Shuetsu Ogasawara, Tokyo (JP); Takao Hamada, Tokyo (JP)

(73) Assignee: Kawatetsu Mining Co., Ltd., Tokyo (JP)

( * ) Notice: Subject to any disclaimer, the term of this patent is extended or adjusted under 35 U.S.C. 154(b) by 145 days.

This patent is subject to a terminal disclaimer.

(21) Appl. No.: 10/442,047

(22) Filed: May 21, 2003

(65) Prior Publication Data

US 2003/0196516 A1 Oct. 23, 2003

Related U.S. Application Data

(60) Continuation of application No. 09/972,926, filed on Oct. 10, 2001, now Pat. No. 6,596,052, which is a division of application No. 09/140,001, filed on Aug. 26, 1998, now Pat. No. 6,402,803.

(30) Foreign Application Priority Data

Sep. 5, 1997 (JP) ............................................. 9-256234

(51) Int. Cl.$^7$ ................................................ B22F 9/28
(52) U.S. Cl. ............................... 419/8; 419/23; 75/369; 361/313
(58) Field of Search ...................... 75/369, 374; 419/8, 419/23, 34; 361/313

(56) References Cited

U.S. PATENT DOCUMENTS

| | | | |
|---|---|---|---|
| 3,850,612 A | 11/1974 | Montino et al. | |
| 3,997,331 A | 12/1976 | Tither | |
| 4,673,430 A | 6/1987 | Pfeil | |
| 4,758,266 A | 7/1988 | Chou | |
| 5,853,451 A | 12/1998 | Ishikawa | |
| 6,168,752 B1 | 1/2001 | Kagohashi et al. | |
| 6,312,496 B1 | 11/2001 | Katayama et al. | |
| 6,391,084 B1 | 5/2002 | Ito et al. | |
| 6,402,803 B1 | 6/2002 | Katayama et al. | |
| 6,596,052 B1 * | 7/2003 | Katayama et al. | ............ 75/369 |

FOREIGN PATENT DOCUMENTS

| | | |
|---|---|---|
| EP | 0 461 866 | 12/1991 |
| JP | A-64-80007 | 3/1989 |
| JP | A-1-136910 | 5/1989 |
| WO | WO 96/14953 | 5/1996 |

* cited by examiner

*Primary Examiner*—George Wyszomierski
(74) *Attorney, Agent, or Firm*—Oliff & Berridge, PLC

(57) ABSTRACT

Provided is an ultrafine nickel powder suitable for a laminated ceramic capacitor electrode material. According to the ultrafine nickel powder, cracks and/or delamination are not liable to generate in the process for producing a ceramic capacitor, and its internal electrode can be made into a thinner layer, and the electric risistivity of the capacitor-can be made low. The ultrafine nickel powder has an average particle size of 0.1–1.0 μm, having the sulfur content of 0.02–1.0% by weight, and particles thereof being spherical, thereby exhibiting excellent properties. They can be produced by vapor phase hydrogen-reducing process using nickel chloride vapor.

13 Claims, 6 Drawing Sheets

METHODS FOR MANUFACTURING CAPACITORS AND ELECTRODES USING ULTRAFINE NICKEL POWDER

This is a Continuation of application Ser. No. 09/972,926 filed Oct. 10, 2001 now U.S. Pat. No. 6,596,052, which in turn is a divisional of application Ser. No. 09/140,001, filed Aug. 26, 1998 now U.S. Pat. No. 6,402,803. The entire disclosure of the prior applications is hereby incorporated by reference herein in its entirety.

BACKGROUND OF THE INVENTION

1. Field of the Invention

The present invention relates to an ultrafine nickel powder which may be used for an internal electrode of a laminated ceramic capacitor, an electrode of a secondary cell, a fuel cell or the like.

2. Description of the Related Art

Much attention has been paid to an ultrafine nickel powder as material to make up electrodes of various parts of electronic devices. Such electrodes include an internal electrode of a laminated ceramic capacitor, a porous electrode of a hydrogen nickel secondary cell, and a hollow porous electrode of a fuel cell for taking out electric energy by electrochemically carrying out oxidization reaction of fuel.

The following will describe the ultrafine nickel powder, mainly giving an internal electrode of the laminated ceramic capacitor as an example.

The laminated ceramic capacitor is a member obtained by laminating dielectric ceramics, such as titanium oxide, barium titanate or complex perovskite, and metal inner electrodes alternately in layers, compressing and sintering it to be united. Recently, the market for the laminated ceramic capacitor for parts of electronic devices has grown rapidly. With the advance of the performance of electrical devices, the laminated ceramic capacitor has been promoted to be downsized and have larger capacitance. Therefore, the inner electrode has been made thinner. In the prior art, palladium was used for the inner electrode of the laminated ceramic capacitor. Recently, however, use of nickel has been increasing because of low price and high reliability.

Japanese Patent Application Laid-Open No. Hei. 1-136910 discloses an invention for producing a nickel powder having a purity of 99% or more and a particle size of 0.1 to 0.3 $\mu$m in a wet process. However, this publication dose not include the description that paste is actually produced from the particles and the paste is used for an electrode of electrical parts. The inventors have investigated the nickel powder, and then found out that the inner electrode made by using the paste of the nickel powder produced in the wet process as in this prior art and laminating it in layers is large in volume change when sintered, so as to easily cause delamination and/or cracks. In the wet process, the crystals in the particles of the ultrafine nickel powder do not grow up to large sizes, and become a cluster of primary particles because the temperature at which the ultrafine nickel powder is produced is relatively low, for example, lower than 100° C. Thus, the internal electrode is easily sintered excessively or is large in volume change when sintered.

Japanese Patent Application Laid-Open No. Sho. 64-80007 discloses paste for electrodes of a porcelain condenser using a nickel powder having an average particle size of 1.0 $\mu$m and a purity of 99.9%. In order to prevent generation of cracks and/or delamination when this electrode paste is sintered, addition of carbide particles into this paste is described. However, this publication never describes any influence of the characteristics of the nickel particles themselves on generation of the cracks and/or delamination.

In the production of any laminated ceramic capacitor, it is important techniques to prevent generation of cracks and/or delamination when sintered, as well as to make thinner layers, miniaturize the size and achieve high capacitance of the inner electrode. Thus, an ultrafine nickel powder has been desired which make it possible to restrain generation of cracks and/or delamination and produce a material for an electrode having a low resistivity.

SUMMARY OF THE INVENTION

In the light of the aforementioned problems in the prior art, an object of the present invention is to provide an improved ultrafine nickel powder. Namely, the object of the invention is to provide an ultrafine nickel powder having the following properties.

(a) Cracks and/or delamination are not liable to be caused in the process for producing a laminated ceramic capacitor.
(b) An internal electrode can be made into a thin layer.
(c) A low electrical resistivity can be realized as an electrode material.

The present invention provides an ultrafine nickel powder comprising a sulfhur content of 0.02 to 1.0% by weight and an average particle size of 0.1 to 1.0 $\mu$m. The ultrafine nickel powder is preferably ones produced from vapor phase hydrogen-reducing vapor of nickel chloride. The ultrafine nickel powder can be used for a porous electrode of a nickel hydrogen cell, or a hollow porous electrode of a fuel cell, but are especially suitable for use as a laminated ceramic capacitor electrode having properties for restraining cracks and/or delamination and for making the electrode thinner and the electric resistivity lower.

DETAILED DESCRIPTION OF THE PREFERRED EMBODIMENTS

Figure 1:
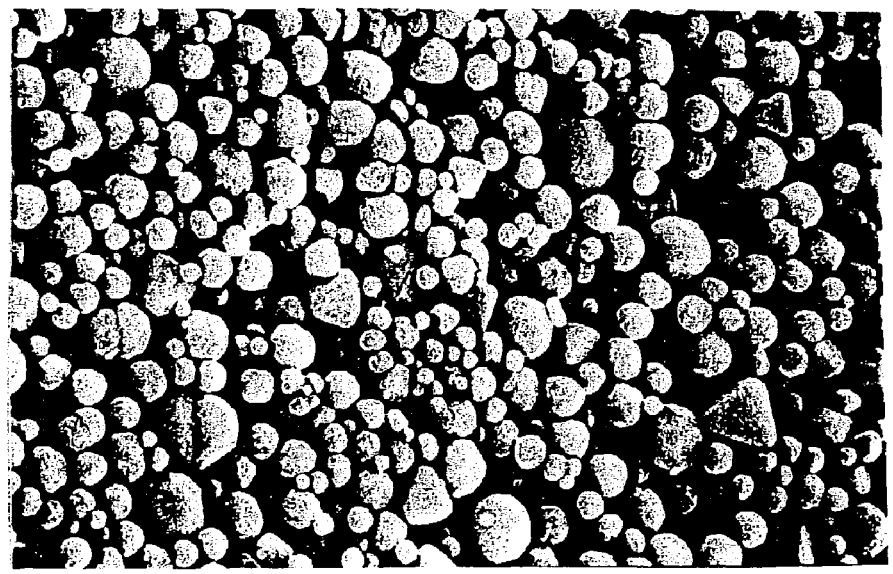
FIG. 1 is a microscopic photography of an ultrafine nickel powder for a laminated ceramic capacitor in Example 1. Magnification: 40000×.

The ultrafine nickel powder is made into paste, and the paste is printed on a dielectric layer film to form an internal electrode. In order to make the internal electrode thin and dense, the average particle size of the ultrafine nickel powder is suitably from 0.1 to 1.0 μm.

If the average particle size is less than 0.1 μm, the nickel layer shrunk excessively when the laminated ceramic capacitor is sintered, so that the internal electrode will become porous. The ultrafine nickel powder having an average particle size of less than 0.1 μm is not preferable because the internal electrode will have high resistivity, or delamination and/or cracks will be caused. On the contrary, if the average particle size is more than 1.0 μm, it will be difficult to make the internal electrode of the laminated ceramic capacitor into a thin layer. The ultrafine nickel powder having an average particle size of more than 1.0 μm is not preferable because the surface of the internal electrode layer will have large irregularities, resulting in generation of cracks. The more preferable average particle size is from 0.2 to 0.6 μm. The average particle size is defined by the 50% particle size ($d_{50}$) in particle size distribution on the basis of the number of particles, obtained from image-analyzing an electron microscopic photograph of the particles.

For an ultrafine nickel powder for a laminated ceramic capacitor, it is important that the particle shape is spherical, and the size is proper. In the process for producing a laminated ceramic capacitor, spherical particles exhibit ideal characteristics that make it possible to form a thin layer internal electrode having a high density of an ultrafine nickel powder and permit no cracks nor delamination to be generated. The inventors have found that the sulfur content therein has a decisive effect in order to make a shperical ultrafine nickel powder. Unless the sulfur content is within the range of 0.02 to 1.0 wt %, angular particles such as hexahedral or octahedral particles appear. These partcicles are not desirable to make a laminated ceramic capacitor. When the sulfur content is from 0.02 to 1.0% by weight, ultrafine nickel powder particles are sufficiently spherical. Therefore, the sulfur content should be controlled within this range to produce spherical ultrafine nickel powder particles.

The ultrafine nickel powder having the aforementioned average particle size and sulfur content is preferable because it may be easily produced by controlling the sulfur content with a vapor phase hydrogen-reduction process. The vapor phase hydrogen-reduction process for nickel chloride can be carried out in a reactor wherein arranged are in sequence a vaporizing section, a reacting section and a cooling section. In the vaporizing secion, $NiCl_2$ is vaporized in a crucible. In the reacting section, $NiCl_2$ vapor carried with innert gas contacts with supplied hydrogen at a controlled temperature. And, in the cooling section, the mixture of synthesized Ni particles and by-product gas is cooled.

The spherical ultrafine nickel power particles can be obtained by the process that either one or both of sulfur and sulfide are accompanied by nickel chloride vapor, inert gas or hydrogen.

The ultrafine nickel powder produced by such a process are made spherical and further the particle sizes of the ultrafine nickel powder are made substantially uniform so that the particle-size distribution will become sharp. Furthermore, good effect can be obtained that the individual ultrafine nickel powder is not composed of a condensed or sintered body of a lot of finer primary particles but is composed of a single particle.

An ultrafine nickel powder to produce high quality laminated ceramic capacitors has been desired. The inventors have carried out experiments on production of laminated ceramic capacitors using various kinds of nickel powders. The characteristics of such powder should be of low resistivity as an electrode material, hard to generate cracks and/or delamination and easy to make a thinner internal electrode. It has been found that such characteristics depends upon the size and shapes of the ultrafine nickel powder particles.

The preferable average particle size is limited to the range from 0.1 to 1.0 μm. If the ultrafine nickel powder whose average particle size is less than 0.1 μm is used, the nickel layer is shrunk because of extremely fine by particles when the laminated ceramic capacitor is sintered, so that the internal electrode will become porous. The electric resistivity of the capacitor will also become high, or delamination and/or cracks will be generated. Thus, the ultrafine nickel powder having an average particle size of less than 0.1 μm are not preferred. On the other hand, if the average particle size is more than 1.0 μm, it will be difficult to make the internal electrode of the laminated ceramic capacitor into a thin layer. The surface of the internal electrode layer will come to have large irregularities, resulting in frequent generation of cracks.

As the shape of the particles becomes more spherical, better results are obtained. According to the research for the present invention, it has been made obvious that making the ultrafine nickel powder spherical can be controlled by the sulfur content in the ultrafine nickel powder. This is because the sulfur functions so that the crystal growth on the surface of the ultrafine nickel powder particle will develop symmetrically in all directions.

As described above, the sulfur content in ultrafine nickel powder having an average particle size of 0.1–1.0 μm is set into the range from 0.02 to 1.0% by weight so that the ultrafine nickel powder can be made spherical. The following will describe specific examples, referring to electron microscopic photographs.

EXAMPLES A

The sulfur contents in the ultrafine nickel powder having an average particle size of about 0.1 μm were varied, and then they were observed with a microscope.

Example 1

When the sulfur content in the ultrafine nickel powder having an average of 0.11 μm was 0.021% by weight, particles of the ultrafine nickel powder were sufficiently spherical as shown in FIG. 1.

Example 2

Figure 2:
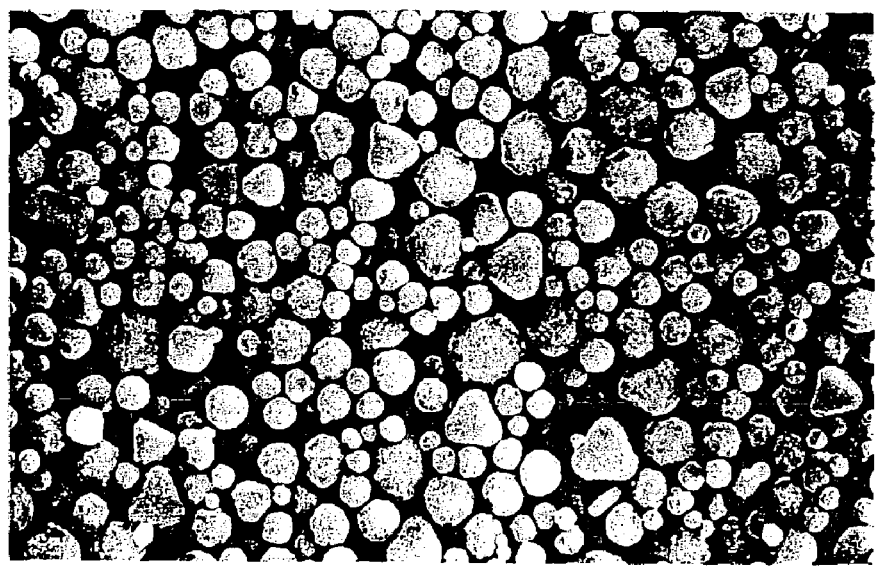
FIG. 2 is a microscopic photography of an ultrafine nickel powder for a laminated ceramic capacitor in Example 2. Magnification: 40000×.

When the sulfur content in the ultrafine nickel powder having an average of 0.10 μm was 1.0% by weight, particles of the ultrafine nickel powder were sufficiently spherical as shown in FIG. 2.

Comparative Example 1

Figure 3:
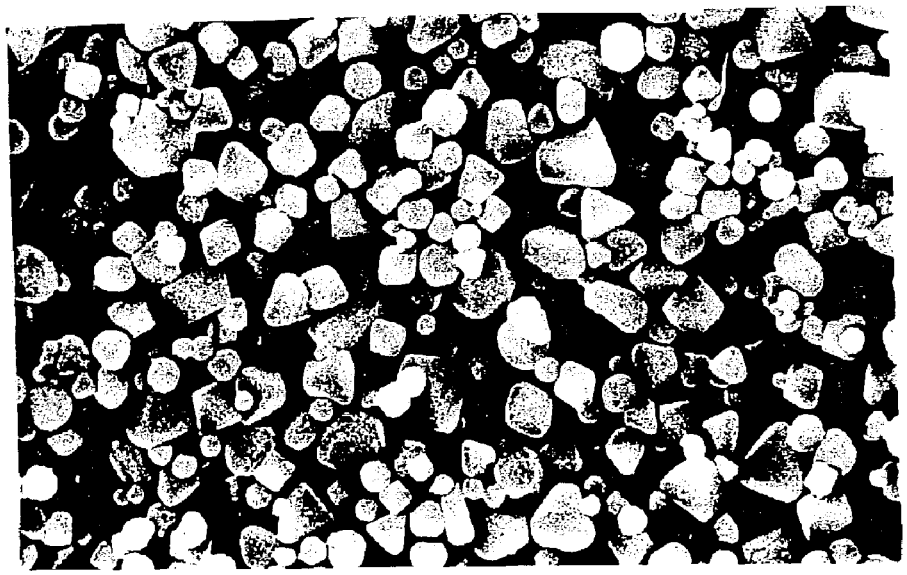
FIG. 3 is a microscopic photography of an ultrafine nickel powder for a laminated ceramic capacitor in Comparative Example 1. Magnification: 40000×.

When the sulfur content in the ultrafine nickel powder having an average of 0.12 μm was 0.012% by weight, the percentage of particles having angular shapes (hexahedral or octahedral particles) to the total particles increased as shown in FIG. 3.

Comparative Example 2

Figure 4:
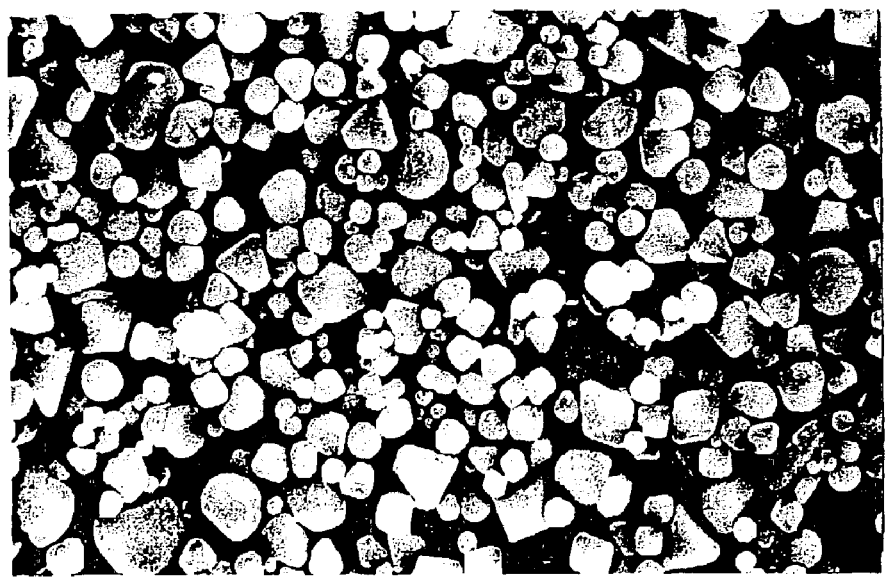
FIG. 4 is a microscopic photography of an ultrafine nickel powder for a laminated ceramic capacitor in Comparative Example 2. Magnification: 40000×.

When the sulfur content in the ultrafine nickel powder having an average of 0.11 μm was 1.4% by weight, the percentage of particles having angular shapes (hexahedral or octahedral particles) to the total particles increased as shown in FIG. 4.

EXAMPLES B

The sulfur contents in the ultrafine nickel powder having an average particle size of about 0.4 μm were varied, and then they were observed with a microscope.

Example 3

Figure 5:
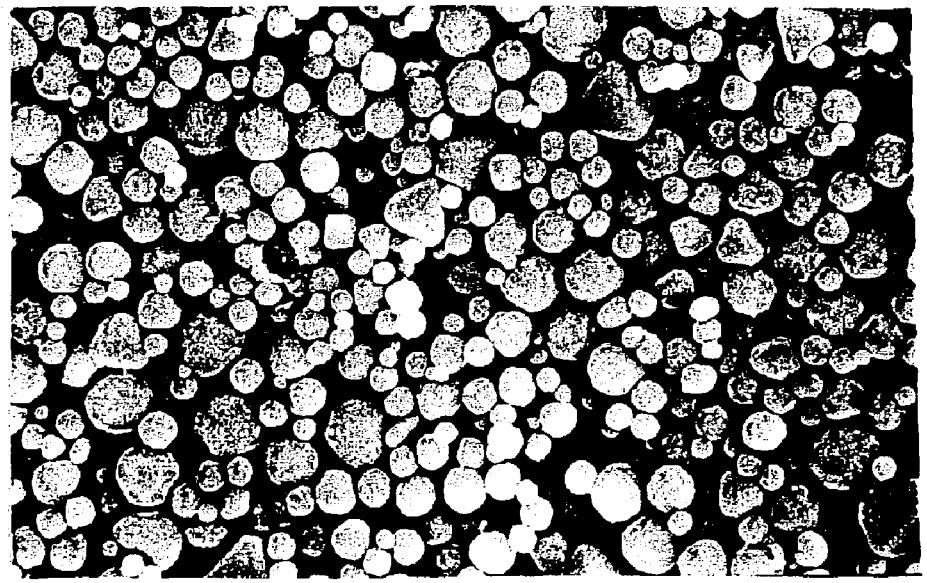
FIG. 5 is a microscopic photography of an ultrafine nickel powder for a laminated ceramic capacitor in Example 3. Magnification: 10000×.

When the sulfur content in the ultrafine nickel powder having an average of 0.40 μm was 0.020% by weight, particles of the ultrafine nickel powder were sufficiently spherical as shown in FIG. 5.

Example 4

Figure 6:
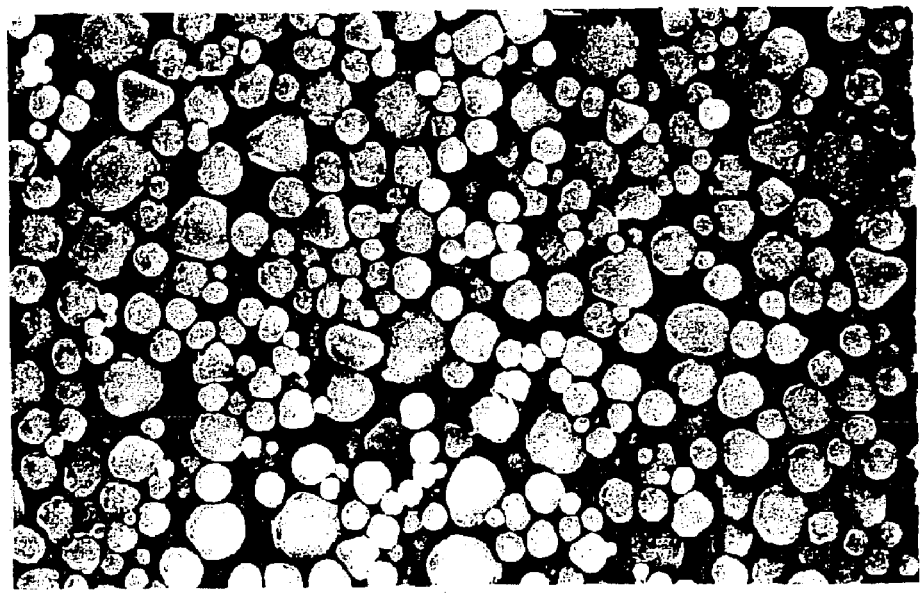
FIG. 6 is a microscopic photography of an ultrafine nickel powder for a laminated ceramic capacitor in Example 4. Magnification: 10000×.

When the sulfur content in the ultrafine nickel powder having an average of 0.42 μm was 0.99% by weight, particles of the ultrafine nickel powder were sufficiently spherical as shown in FIG. 6.

Comparative Example 3

Figure 7:
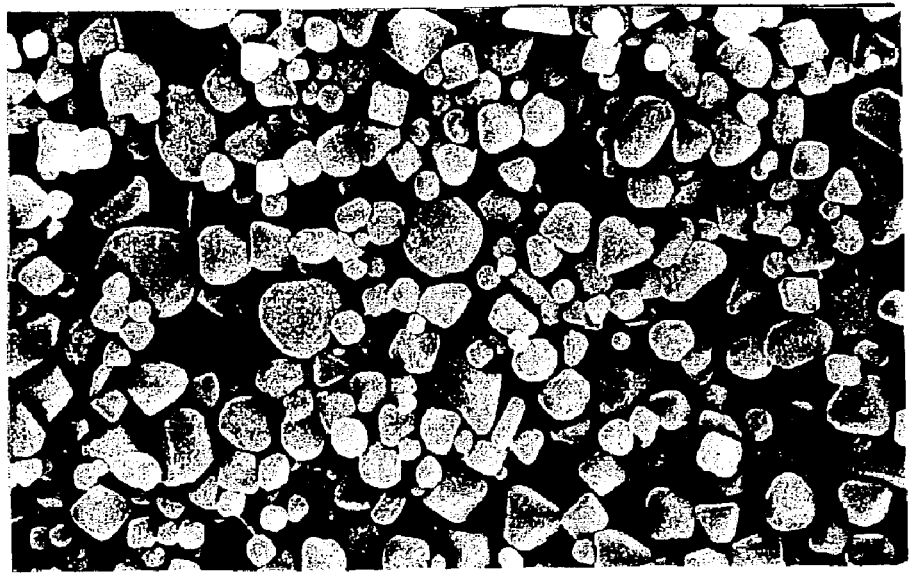
FIG. 7 is a microscopic photography of an ultrafine nickel powder for a laminated ceramic capacitor in Comparative Example 3. Magnification: 10000×.

When the sulfur content in the ultrafine nickel powder having an average of 0.44 μm was 0.011% by weight, the percentage of particles having angular shapes (hexahedral or octahedral particles) to the total particles increased as shown in FIG. 7.

Comparative Example 4

Figure 8:
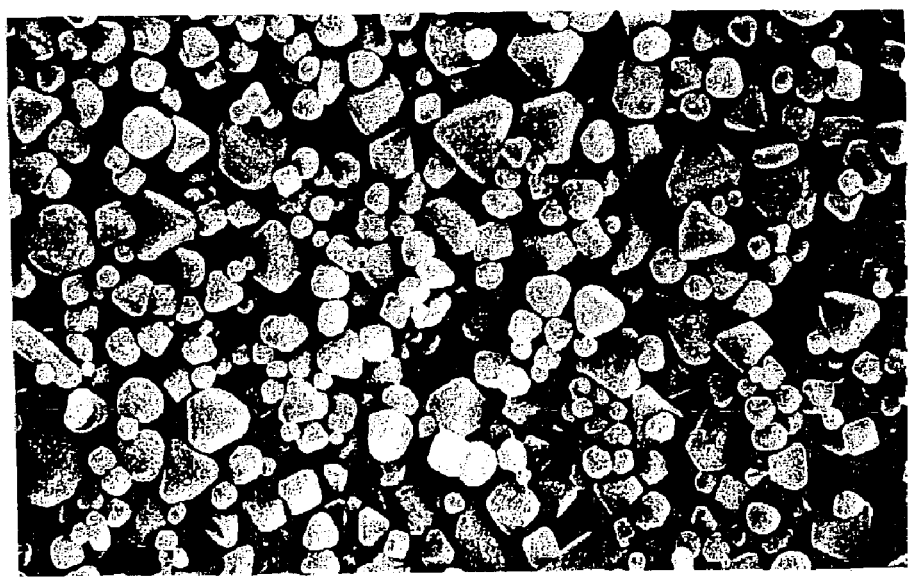
FIG. 8 is a microscopic photography of an ultrafine nickel powder for a laminated ceramic capacitor in Comparative Example 4. Magnification: 10000×.

When the sulfur content in the ultrafine nickel powder having an average of 0.41 μm was 1.5% by weight, the percentage of particles having angular shapes (hexahedral or octahedral particles) to the total particles increased as shown in FIG. 8.

EXAMPLES C

The sulfur contents in the ultrafine nickel powder having an average particle size of about 1.0 μm were varied, and then they were observed with a microscope.

Example 5

Figure 9:
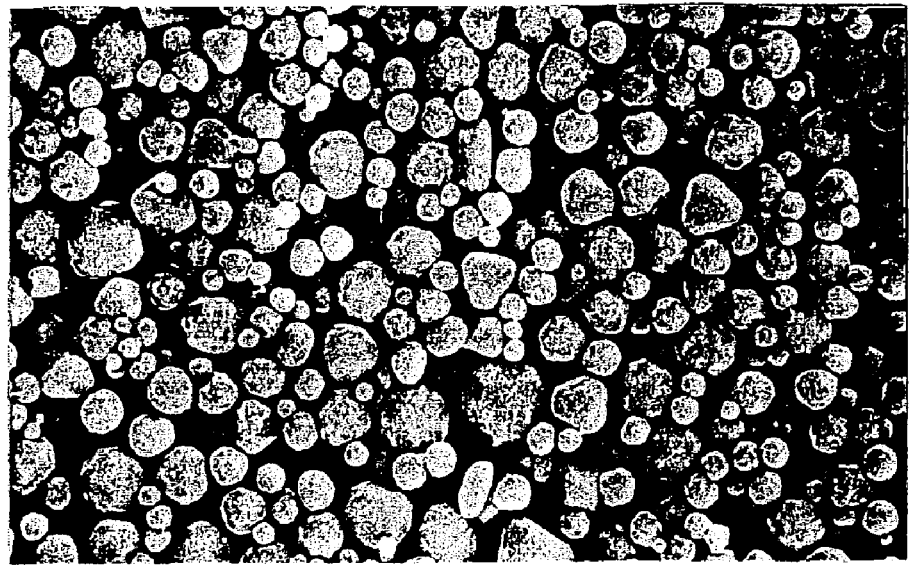
FIG. 9 is a microscopic photography of an ultrafine nickel powder for a laminated ceramic capacitor in Example 5. Magnification: 4000×.

When the sulfur content in the ultrafine nickel powder having an average of 1.0 μm was 0.019% by weight, particles of the ultrafine nickel powder were sufficiently spherical as shown in FIG. 9.

Example 6

Figure 10:
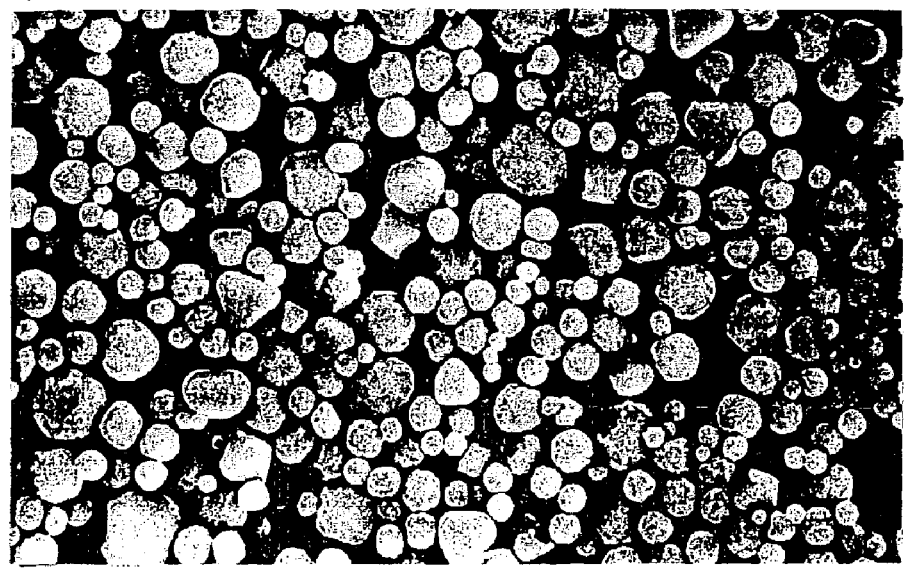
FIG. 10 is a microscopic photography of an ultrafine nickel powder for a laminated ceramic capacitor in Example 6. Magnification: 4000×.

When the sulfur content in the ultrafine nickel powder having an average of 0.99 μm was 1.0% by weight, particle of the ultrafine nickel powder were sufficiently spherical as shown in FIG. 10.

Comparative Example 5

Figure 11:
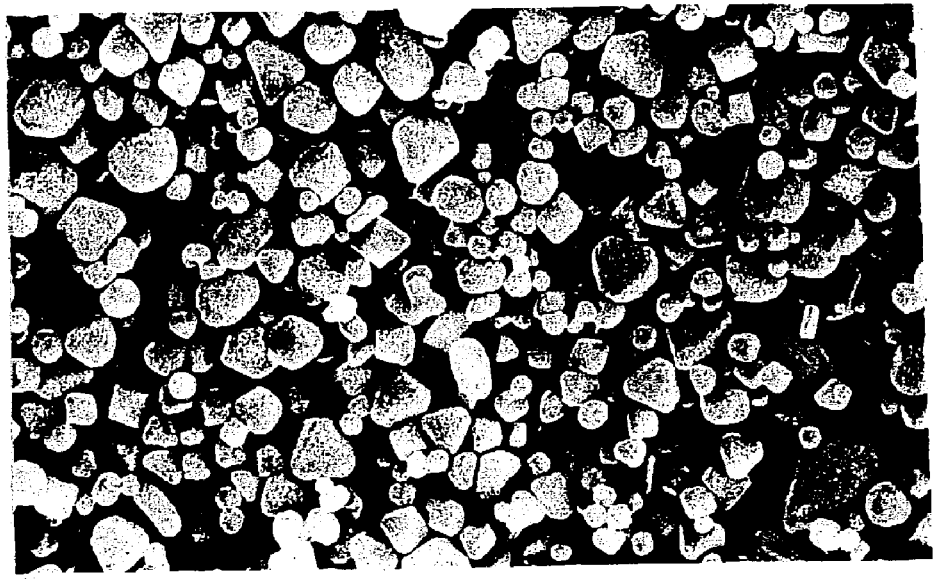
FIG. 11 is a microscopic photography of an ultrafine nickel powder for a laminated ceramic capacitor in Comparative Example 5. Magnification: 4000×.

When the sulfur content in the ultrafine nickel powder having an average of 0.98 μm was 0.010% by weight, the percentage of particles having angular shapes (hexahedral or octahedral particles) to the total particles increased as shown in FIG. 11.

Comparative Example 6

Figure 12:
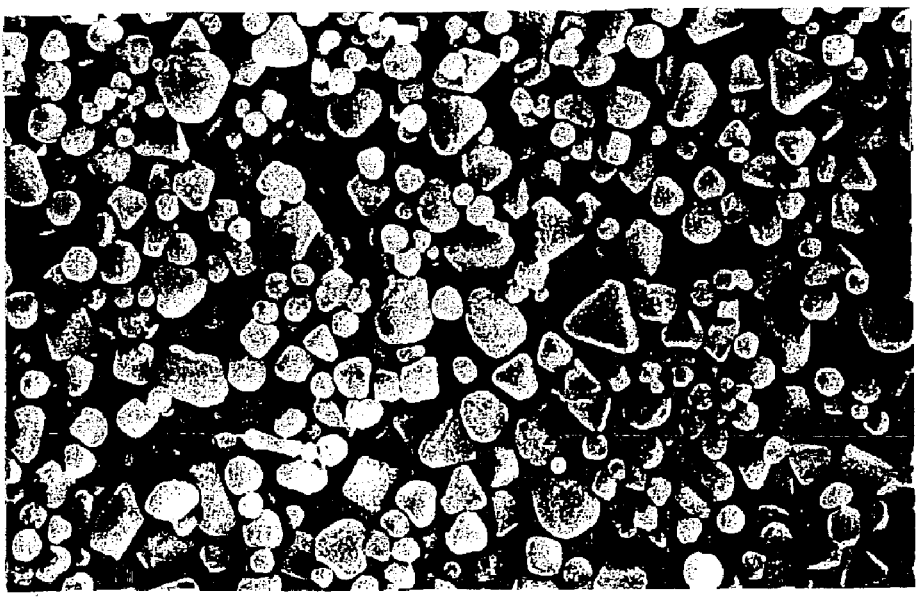
FIG. 12 is a microscopic photography of an ultrafine nickel powder for a laminated ceramic capacitor in Comparative Example 6. Magnification: 4000×.

When the sulfur content in the ultrafine nickel powder having an average of 1.1 μm was 1.3% by weight, the percentage of particles having angular shapes (hexahedral or octahedral particles) to the total particles increased as shown in FIG. 12.

The above-mentioned results are together shown in Table 1.

TABLE 1

| | Average particle size (μm) | Sulfur content (% by weight) | Spherical characteristic of an ultrafine nickel powder | Rate of cracks and delamination | |
|---|---|---|---|---|---|
| Example 1 | 0.11 | 0.021 | good | ⊙ | FIG. 1 |
| Example 2 | 0.10 | 1.0 | good | ⊙ | FIG. 2 |
| Comparative Example 1 | 0.12 | 0.012 | Many angular particles | X | FIG. 3 |
| Comparative Example 2 | 0.11 | 1.4 | Many angular particles | X | FIG. 4 |
| Example 3 | 0.40 | 0.020 | good | ⊙ | FIG. 5 |
| Example 4 | 0.42 | 0.99 | good | ⊙ | FIG. 6 |
| Comparative Example 3 | 0.44 | 0.011 | Many angular particles | X | FIG. 7 |
| Comparative Example 4 | 0.41 | 1.5 | Many angular particles | X | FIG. 8 |
| Example 5 | 1.0 | 0.019 | good | ○ | FIG. 9 |
| Example 6 | 0.99 | 1.0 | good | ○ | FIG. 10 |
| Comparative Example 5 | 0.98 | 0.010 | Many angular particles | X X | FIG. 11 |
| Comparative Example 6 | 1.1 | 1.3 | Many angular particles | X X | FIG. 12 |

As understood from the above, in the cases wherein the sulfur content in the ultrafine nickel powder was from 0.02 to 1.0% by weight, the ultrafine nickel powder became sufficient spherical. It is considered that particles of the ultrafine nickel powder are made spherical because the surface growth of the nickel particle progresses almost uniformly in all directions. Particles of the ultrafine nickel powder can be made spherical by controlling the sulfur content within a proper range.

Pastes of the respective particles obtained from Examples 1–6 and Comparative Examples 1–6 were used to produce laminated ceramic capacitors, and whether or not delamination was caused when the capacitors were sintered was examined. The respective pastes of the ultrafine nickel powder were printed-on green sheets wherein the thickness of their dielectrics was about 3 μm, so that the thickness of the pastes would be 2 μm. Electrodes and dielectric layers were alternately laminated so that the total number of the layers would be 200, and then the multilayer body was compressed, cut, and dried. After binders were removed off, the multilayer body was sintered at 1200° C. in mixed gas of hydrogen and nitrogen. A laminated capacitor 3.2 mm long, 1.6 mm wide and 1.6 mm thick was obtained.

For 300 laminated capacitors thus obtained, whether cracks and/or delamination were generated or not was examined, and results from the examination are also shown in Table 1. In Table 1, the rate of generation of cracks or delamination is shown as follows:

⊙: 1% or less,
○: more than 1% but 10% or less,
X: more than 10% but 50% or less, and
XX: more than 50%.

As shown in the columns for the Examples, when the ultrafine nickel powder meeting the characteristics defined in the present invention were used, the rate of generation of cracks and/or delamination was low, and the internal electrode was be able to be made into a thin layer. On the contrary, in the Comparative Examples, many cracks and delamination were generated because the samples therein did not meet the characteristics defined in the present invention.

In the above description, the ultrafine nickel powder was explained mainly about ones used for internal electrodes of laminated ceramic capacitors. However, the ultrafine nickel powder according to the present invention is not limited to this application, and can be applied to an electrode material for a secondary cell, fuel cell and others.

The present invention makes it possible to provide an ultrafine nickel powder which has atisfactory particle shapes and is suitable for various applications, and in particular to make internal electrodes of a laminated ceramic capacitor into thin layers, reduce their electrical resistance, and prevent generation of delamination and/or cracks when the capacitor is sintered.

What is claimed is:

1. A method for manufacturing a laminated ceramic capacitor, comprising:
   (a) providing an ultrafine nickel powder made by subjecting nickel chloride to a vapor phase hydrogen-reducing process in the presence of supplied sulfur to form said ultrafine nickel powder having a sulfur content of 0.02 to 1.0 wt % and an average particle size of 0.1 to 1.0 $\mu$m;
   (b) printing a paste of the ultrafine nickel powder to form an internal electrode layer on a first ceramic dielectric sheet layer;
   (c) stacking a second ceramic dielectric sheet layer on the printed internal electrode layer;
   (d) repeating steps (b) and (c) at least one time to form a multilayer body;
   (e) pressing the multilayer body; and
   (f) cutting and sintering the multilayer body.

2. The method of claim 1, wherein the ultrafine nickel powder comprises individual particles, and a major portion of the individual particles are spherical particles.

3. The method of claim 2, wherein each individual particle is separate from substantially every other individual particle.

4. The method of claim 3, wherein the average particle size is 0.2 to 0.6 $\mu$m.

5. The method of claim 2, wherein the average particle size is 0.2 to 0.6 $\mu$m.

6. The method of claim 1, wherein the average particle size is 0.2 to 0.6 $\mu$m.

7. A method of making a laminated ceramic capacitor, comprising:
   providing an ultrafine nickel powder made by subjecting nickel chloride to a vapor phase hydrogen-reducing process in the presence of supplied sulfur to form an ultrafine nickel powder having a sulfur content of 0.02 to 1.0 wt % and an average particle size of 0.1 to 1.0 $\mu$m; and
   printing a paste of the ultrafine nickel powder on a ceramic dielectric layer.

8. A method for manufacturing an electrode, comprising:
   providing an ultrafine nickel powder made by subjecting nickel chloride to a vapor phase hydrogen-reducing process in the presence of supplied sulfur to form an ultrafine nickel powder having a sulfur content of 0.02 to 1.0 wt % and an average particle size of 0.1 to 1.0 $\mu$m; and
   forming an electrode from the nickel powder.

9. The method of claim 8, wherein the ultrafine nickel powder comprises individual particles, and a major portion of the individual particles are spherical particles.

10. The method of claim 9, wherein each individual particle is separate from substantially every other individual particle.

11. The method of claim 10, wherein the average particle size is 0.2 to 0.6 $\mu$m.

12. The method of claim 9, wherein the average particle size is 0.2 to 0.6 $\mu$m.

13. The method of claim 8, wherein the average particle size is 0.2 to 0.6 $\mu$m.

* * * * *